United States Patent
Ding et al.

(10) Patent No.: US 8,907,470 B2
(45) Date of Patent: Dec. 9, 2014

(54) MILLIMETER WAVE WAFER LEVEL CHIP SCALE PACKAGING (WLCSP) DEVICE AND RELATED METHOD

(71) Applicant: International Business Machines Corporation, Armonk, NY (US)

(72) Inventors: Hanyi Ding, Colchester, VT (US); Richard S. Graf, Gray, ME (US); Gary R. Hill, Essex Junction, VT (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/772,715

(22) Filed: Feb. 21, 2013

(65) Prior Publication Data

US 2014/0231992 A1    Aug. 21, 2014

(51) Int. Cl.
*H01L 23/492* (2006.01)
*H01L 21/66* (2006.01)
*H01L 23/498* (2006.01)

(52) U.S. Cl.
CPC .......... *H01L 23/49816* (2013.01); *H01L 22/12* (2013.01); *H01L 23/49811* (2013.01)
USPC ........... 257/693; 257/692; 257/738; 257/780; 257/E23.069; 438/613

(58) Field of Classification Search
CPC ................... H01L 23/498; H01L 23/49816
USPC ................. 257/690–693, 738, 780, E23.021, 257/E23.069; 438/612, 613
See application file for complete search history.

(56) References Cited

U.S. PATENT DOCUMENTS

| 6,514,783 B1 | 2/2003 | Welstand |
| 6,732,913 B2 | 5/2004 | Alvarez |

(Continued)

FOREIGN PATENT DOCUMENTS

| JP | 2004-304023 | 10/2004 |
| JP | 2008-103387 | 5/2008 |
| JP | 2012-009602 | 1/2012 |

OTHER PUBLICATIONS

"A wafer-level-chip-size-package technique with inverted microstrip lines for mm-wave Si CMOS ICs" Kawai, Y.; Ujita, S.; Fukuda, T.; Sakai, H.; Ueda, T.; Tanaka, T. Microwave Conference Proceedings (APMC), 2010 Asia-Pacific Publication Year: 2010 , pp. 1841-1844.

(Continued)

*Primary Examiner* — Allan R Wilson
(74) *Attorney, Agent, or Firm* — David A. Cain; Hoffman Warnick LLC

(57) ABSTRACT

Various embodiments include wafer level chip scale package (WLCSP) structures and methods of tuning such structures. In some embodiments, the WLCSP structure includes: a printed circuit board (PCB) trace connection including at least one PCB ground connection connected with a PCB ground plane; a set of ground solder balls each contacting the printed circuit board trace connection; a set of chip pads contacting each of the ground solder balls in the set of ground solder balls; a chip ground plane connecting the set of chip pads; and a signal interconnect interposed between two of the set of ground solder balls, the signal interconnect including: a signal trace connection electrically isolated from the PCB ground plane; a signal ball contacting the signal PCB trace connection; a chip pad contacting the signal ball, and a signal trace connection on a chip contacting the chip pad.

9 Claims, 10 Drawing Sheets

(56) References Cited

U.S. PATENT DOCUMENTS

| | | | |
|---|---|---|---|
| 6,879,039 B2* | 4/2005 | Khan et al. .................... | 257/730 |
| 7,375,422 B2* | 5/2008 | Katagiri et al. ............... | 257/686 |
| 7,405,477 B1* | 7/2008 | Tao et al. ...................... | 257/728 |
| 7,892,858 B2 | 2/2011 | Liu et al. | |
| 7,977,783 B1* | 7/2011 | Park et al. .................... | 257/692 |
| 8,093,700 B2 | 1/2012 | Tang | |
| 2002/0124385 A1 | 9/2002 | Tsai et al. | |
| 2002/0124985 A1 | 9/2002 | Takata et al. | |
| 2003/0001254 A1* | 1/2003 | Jackson et al. ............... | 257/691 |
| 2008/0158069 A1 | 7/2008 | Mateus Mendes et al. | |
| 2009/0026608 A1* | 1/2009 | Tsai et al. ..................... | 257/737 |
| 2009/0039508 A1* | 2/2009 | Kaufmann .................... | 257/738 |
| 2010/0320591 A1* | 12/2010 | Camacho et al. ............. | 257/692 |
| 2012/0161898 A1 | 6/2012 | Gorbachov | |

OTHER PUBLICATIONS

"Influence of solder microstructure and oxide layers on high frequency electrical losses of WL-CSP Pb-free interconnections" Burlacu, D.; Nguyen, L.; Kivilahti, J. Electronic Components and Technology Conference, 2006. Proceedings. 56th Digital Object Identifier: 10.1109/ECTC.2006.1645707.

Heinrich, "The Flip-Chip Approach for Millimeter-Wave Packaging", IEEE Microwave Magazine, Sep. 2005, pp. 36-45.

Pfeiffer et al., "A Chip-Scale Packaging Technology for 60-GHz Wireless Chipsets", IEEE Transactions on Microwave Theory and Techniques, vol. 54, No. 8, Aug. 2006, pp. 3387-3397.

Wojnowski et al., "A 77 GHz SiGe Mixer in an Embedded Wafer Level BGA Package", IEEE Electronic Components and Technology Conference, 2008, pp. 290-296.

* cited by examiner

MILLIMETER WAVE WAFER LEVEL CHIP SCALE PACKAGING (WLCSP) DEVICE AND RELATED METHOD

FIELD

The subject matter disclosed herein relates to interconnect devices for integrated circuits. More particularly, the subject matter relates to millimeter wave wafer level chip scale packaging (WLCSP).

BACKGROUND

As silicon technologies have advanced, the bandwidth at which circuits utilizing those technologies can perform has also advanced. Packaging these circuits (e.g., those capable of bandwidths up to approximately 100 Giga-Hertz (GHz)) can be particularly challenging as silicon technologies have advanced. Some conventional approaches have involved using wafer level chip scale packaging (WLCSP) for some millimeter-wave circuit products. WLCSP involves mounting a chip directly on a printed circuit board (PCB), eliminating the need for a package carrier (employed in older approaches).

However, conventional WLCSP has shortcomings, including for example: a) standard conventional WLCSP uses relatively large ball diameters (approximately 250 micrometers (um) for 400 um pitch-minimum ball pitch on PCB for current cost effectiveness) and height (approximately 200 um for 250 um ball diameter). This conventional WLCSP has been shown to incur a −10 dB return loss bandwidth of approximately 70 GHz; and b) specialized conventional WLCSP designs use relatively small ball diameters, e.g., approximately 30 um to approximately 100 um, which may extend the bandwidth of the packaging to approximately 100 GHz. However, the specialized designs have higher manufacturing costs (relative to the standard designs), can cause wafer test issues due to the small ball size, and can also have performance inconsistency between designs utilizing and not utilizing PCB pads, which may result in wafer test yield issues.

BRIEF DESCRIPTION

Various embodiments described include wafer level chip scale package (WLCSP) structures and methods of tuning such structures. In some embodiments, the WLCSP structure includes: a printed circuit board (PCB) trace connection including at least one PCB ground connection (i.e. a PCB via) connected with a PCB ground plane; a set of ground solder balls each contacting the printed circuit board trace connection; a set of chip pads contacting each of the ground solder balls in the set of ground solder balls; a chip ground plane connecting the set of chip pads (e.g., through a set of chip via arrays); and a signal interconnect interposed between two of the set of ground solder balls, the signal interconnect including: a signal trace connection electrically isolated from the PCB ground plane; a signal ball contacting the signal trace connection; a chip pad contacting the signal ball; and a signal trace on a chip contacting the chip pad.

A first aspect includes a wafer level chip scale package (WLCSP) structure having: a printed circuit board (PCB) trace connection including at least one PCB ground connection connected with a PCB ground plane; a set of ground solder balls each contacting the printed circuit board trace connection; a set of chip pads contacting each of the ground solder balls in the set of ground solder balls; a chip ground plane connecting the set of chip pads; and a signal interconnect interposed between two of the set of ground solder balls, the signal interconnect including: a signal trace connection electrically isolated from the PCB ground plane; a signal ball contacting the signal trace connection; a chip pad contacting the signal ball; and a signal trace on a chip contacting the chip pad.

A second aspect includes a wafer level chip scale package (WLCSP) structure including: a printed circuit board (PCB) trace connection including at least one PCB ground connection connected with a PCB ground plane; a set of ground pillars each contacting the printed circuit board trace connection; a set of chip pads contacting each of the ground pillars in the set of ground pillars; a chip ground plane connecting the set of chip pads; and a signal interconnect interposed between two of the set of ground pillars, the signal interconnect including: a signal trace connection electrically isolated from the PCB ground plane; a signal pillar contacting the signal trace connection; a chip pad contacting the signal pillar; and a signal trace on a chip contacting the chip pad.

A third aspect includes a method of tuning a wafer level chip scale package (WLCSP) structure, the method including: providing the WLCSP structure including: a printed circuit board (PCB) trace connection including at least one PCB ground connection connected with a PCB ground plane, wherein the PCB ground plane includes an opening; a set of contact devices each contacting the printed circuit board trace connection; a set of chip pads contacting each of the contact devices in the set of contact devices; a chip ground plane connecting the set of chip pads, the chip ground plane including an opening; and a signal interconnect interposed between two of the set of contact devices, the signal interconnect including: a signal trace connection electrically isolated from the PCB ground plane; a signal contact device contacting the signal trace connection; a chip pad contacting the signal contact device; and a signal trace on a chip contacting the chip pad; determining a performance parameter of the WLCSP structure; and tuning a size of at least one of the opening in the PCB ground plane or the opening in the chip ground plane based upon the determined performance parameter.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
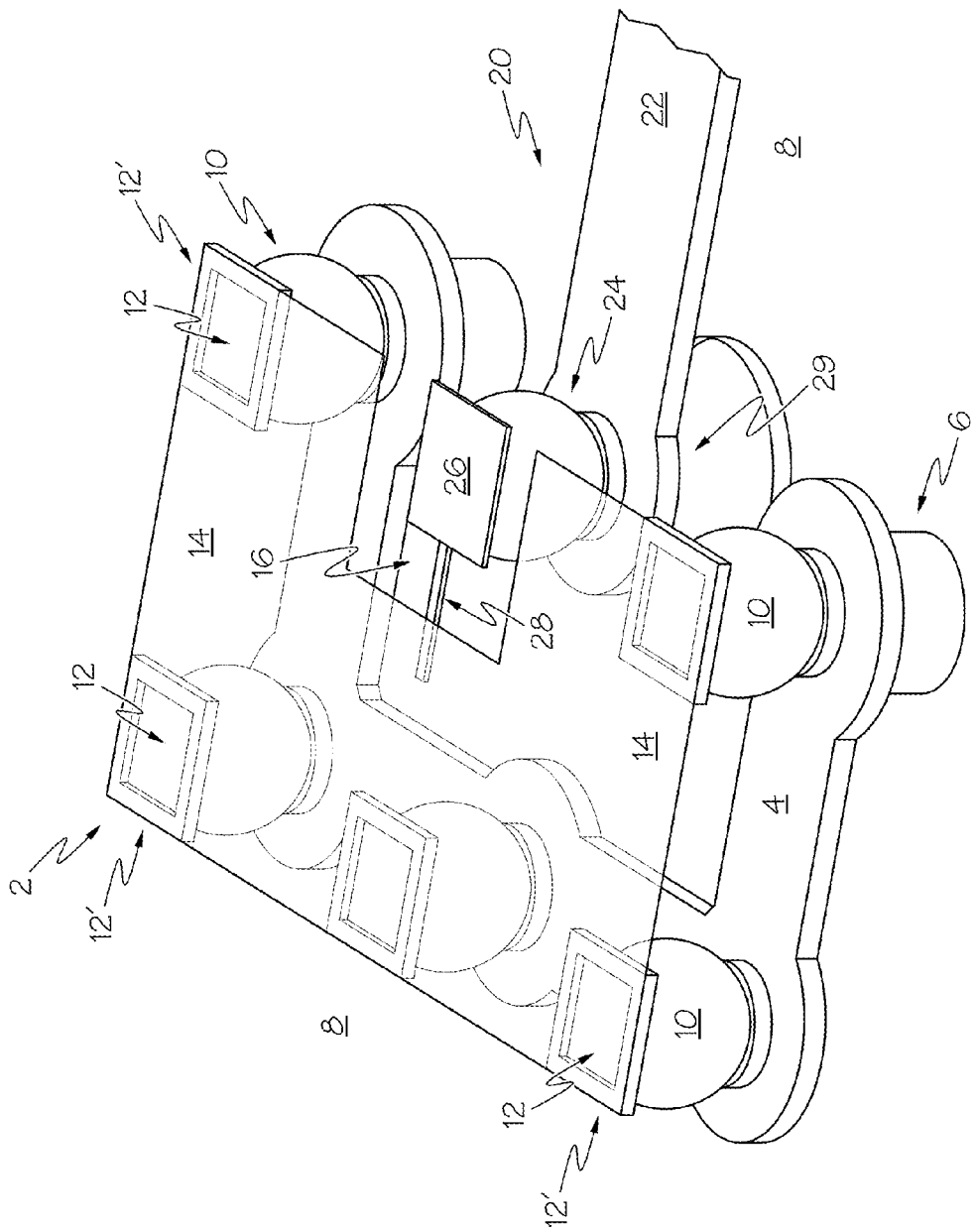
FIG. 1 shows a three-dimensional depiction of a wafer level chip scale packaging (WLCSP) structure including solder balls according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to interconnect devices for integrated circuits. More particularly, the subject matter relates to millimeter wave wafer level chip scale packaging (WLCSP).

As described herein, conventional WLCSP has shortcomings, including for example: a) standard conventional WLCSP uses relatively large ball diameters (currently approximately 250 micrometers (um) for 400 um pitch-minimum ball pitch on PCB for cost effectiveness) and height (approximately 200 um for 250 um ball diameter). However, this conventional WLCSP has been shown to incur a −10 dB return loss bandwidth of approximately 70 GHz; and b) specialized conventional WLCSP designs use relatively small ball diameters, e.g., approximately 30 um to approximately 100 um, which may extend the bandwidth of the packaging to approximately 100 GHz. However, the specialized designs have higher manufacturing costs (relative to the standard designs), can cause wafer test issues due to the small ball size, and can also exhibit performance inconsistency between designs utilizing and not utilizing PCB pads, which may result in wafer test yield issues.

Various embodiments of the invention include WLCSP designs and related methods of use that provide relatively high bandwidth (e.g., approximately 100 GHz) with or without PCB pads, allowing for performance consistency which makes wafer level testing more accurate.

Various embodiments of the invention include a WLCSP for millimeter wave applications which can realize one or more of the following benefits:

A) The design considers a full path from the chip pad to the PCB pad through the solder ball;

B) The design utilizes a targeted (e.g., optimized) solder ball size (e.g., approximately 120 to approximately 180 um diameter and approximately 100 to approximately 150 um height), with corresponding chip pad and passivation opening sizes;

C) The design utilizes a solder ball pitch that is available for direct PCB mount productions (e.g., approximately 400 um pitch);

D) The design utilizes PCB pad and solder mask opening sizes compatible with conventional PCB manufacturing with an in-pad standard via, which may utilize either solder mask defined (SMD) pads or non solder mask defined pads (NSMD);

E) The design utilizes the edge solder ball path for signal with five surrounding ball paths as the ground or return path, giving a well-defined, enclosed signal path;

F) The design conforms to both chip and PCB design rules for coping with available chip and PCB processes; and/or G) The design may utilize underfill for improved reliability of chip to PCB interconnections.

Additional benefits of the various aspects of the invention include: a) extending the WLCSP bandwidth beyond approximately 100 GHz, as compared with the standard design bandwidth of approximately 70 GHz; b) approximately the same low cost when compared with the standard WLCSP design; and/or c) consistent performance with or without the PCB pads, so that wafer tests can indicate accurate chip performance.

Various particular embodiments of the invention include a wafer level chip scale package (WLCSP) structure having: a printed circuit board (PCB) trace connection including at least one PCB ground connection (i.e. a PCB via) connected with a PCB ground plane; a set of ground solder balls each contacting the printed circuit board trace connection; a set of chip pads contacting each of the ground solder balls in the set of ground solder balls; a chip ground plane connecting the set of chip pads (through a set of chip via arrays); and a signal interconnect interposed between two of the set of ground solder balls, the signal interconnect including: a signal trace connection electrically isolated from the PCB ground plane; a signal ball contacting the signal trace connection; a chip pad contacting the signal ball; and a signal trace on a chip contacting the chip pad.

Various additional particular embodiments of the invention include a wafer level chip scale package (WLCSP) structure including: a printed circuit board (PCB) trace connection including at least one PCB ground connection (i.e. a PCB via) connected with a PCB ground plane; a set of ground pillars each contacting the printed circuit board trace connection; a set of chip pads contacting each of the ground pillars in the set of ground pillars; a chip ground plane connecting the set of chip pads (through a set of chip via arrays); and a signal interconnect interposed between two of the set of ground pillars, the signal interconnect including: a signal trace connection electrically isolated from the PCB ground plane; a signal pillar contacting the signal trace connection; a chip pad contacting the signal pillar; and a signal trace on a chip contacting the chip pad.

Further particular embodiments of the invention include a method of tuning a wafer level chip scale package (WLCSP) structure, the method including: providing the WLCSP structure including: a printed circuit board (PCB) trace connection including at least one PCB ground connection (i.e. a PCB via) connected with a PCB ground plane, wherein the PCB ground plane includes an opening; a set of contact devices each contacting the printed circuit board trace connection; a set of chip pads contacting each of the contact devices in the set of contact devices; a chip ground plane connecting the set of chip pads (through a set of chip via arrays), the chip ground plane including an opening; and a signal interconnect interposed between two of the set of contact devices, the signal interconnect including: a signal trace connection electrically isolated from the PCB ground plane; a signal contact device contacting the signal trace connection; a chip pad contacting the signal contact device; and a signal trace on a chip contacting the chip pad; determining a performance parameter of the WLCSP structure; and tuning a size of at least one of the opening in the PCB ground plane or the opening in the chip ground plane based upon the determined performance parameter.

The term "trace connection" (or simply "trace") is used herein to refer to a single piece of metal shape on a metal layer, which electrically (and physically) connects components. It is understood that as used herein, the term "contact device," "contact devices," "ground contact devices" and/or "signal contact devices" can refer to one or both of a solder ball structure or a pillar structure. That is, the "contact device(s)" claimed herein can include solder ball structures and/or pillar structures, of which, some are ground or signal contact devices.

Turning to FIG. 1, a three-dimensional perspective view of a WLCSP structure 2 (using solder balls) is shown according to various embodiments. As shown, the WLCSP structure 2 can include a printed circuit board (PCB) trace connection 4, (e.g., on the top metal/wiring layer of the PCB), including at least one ground connection 6 (i.e. a PCB via) connected with a PCB ground plane 8 (on a different metal/wiring layer than the trace connection 4, e.g. the second metal/wiring layer of the PCB). That is, the PCB trace connection 4 is electrically grounded in at least one location (ground connection 6), and in this example, two such locations (i.e. two PCB vias) are shown. Contacting the PCB trace connection 4 is a set of ground solder balls 10, where each of the ground solder balls 10 is electrically connected to the PCB ground plane 8 via the PCB trace connection 4.

Overlying and contacting each the set of ground solder balls 10 is a set of chip pads 12 (e.g., integrated circuit chip pads normally on the last metal/wiring layer of the chip), where each chip pad 12 contacts a distinct solder ball 10 in the set of solder balls 10. Each chip pad 12 is therefore connected to the PCB ground plane 8 via a solder ball 10 and the PCB trace connection 4.

Each chip pad 12 is connected with a chip ground plane 14, which is on a different chip metal/wiring layer than the chip pad (e.g. the second metal/wiring layer of the chip), through a chip via array 12' (the annular square ring). The chip ground plane 14 can be connected to the chip ground via any conventional connection (e.g., any conventional ground connection, not shown). As shown, the PCB trace connection 4, ground solder balls 10, chip pads 12, chip via array 12' and chip ground plane 14 form a "C-shaped" or semi annular shape having an opening 16 in a region interposed between two of the ground solder balls 10.

According to various embodiments, a signal interconnect 20 is interposed between two of the ground solder balls 10 (in the opening 16). The signal interconnect 20, the chip ground opening 16 and the PCB ground opening 29, as described herein, are configured to tune the WLCSP structure 2 in order to control the performance (e.g., return loss) of the WLCSP structure 2. The signal interconnect 20 can include: a signal trace connection 22 on the top metal/wiring layer of the PCB, which is electrically isolated from the PCB ground plane 8, where the PCB ground plane 8 is on a different metal/wiring layer of the PCB than the signal trace connection 22. The signal interconnect 20 can also include a signal ball 24 contacting the signal trace connection 22, and a chip pad 26 contacting the signal ball 24. According to various embodiments, the signal trace connection 22 forms a microstrip line with the PCB ground plane 8 for carrying a signal. In various embodiments, the WLCSP structure 2 can include a signal trace 28, which may be on the same chip metal/wiring layer as the chip pads 12 (i.e. the last metal/wiring layer) and is electrically connected with the chip pad 26 contacting the signal ball 24. The signal trace 28 is electrically isolated from the chip side ground plane 14 (on a different chip metal/wiring layer, e.g. the second metal/wiring layer of the chip), forming an on-chip microstrip line with the chip side ground plane 14.

In some cases, the set of ground solder balls 10 and signal solder ball 24 can have a substantially equal diameter. That is, each solder ball is substantially the same size. As will be described herein, a diameter of the solder ball is directly related to a signal performance parameter in the WLCSP structure 2. That is, the diameter of the solder balls can control an amount of the signal loss in the WLCSP structure 2. In this sense, the signal loss of the WLCSP structure 2 is modifiable (tunable) by modifying a diameter of the solder balls.

In various embodiments, the WLCSP structure can utilize solder mask defined or non solder mask defined pads for connection of the solder balls (10 and 24) to the PCB trace connection (4 and 22).

In various embodiments, the WLCSP structure can utilize underfill to improve the reliability of the interconnection of solder balls (10 and 24).

Figure 2:
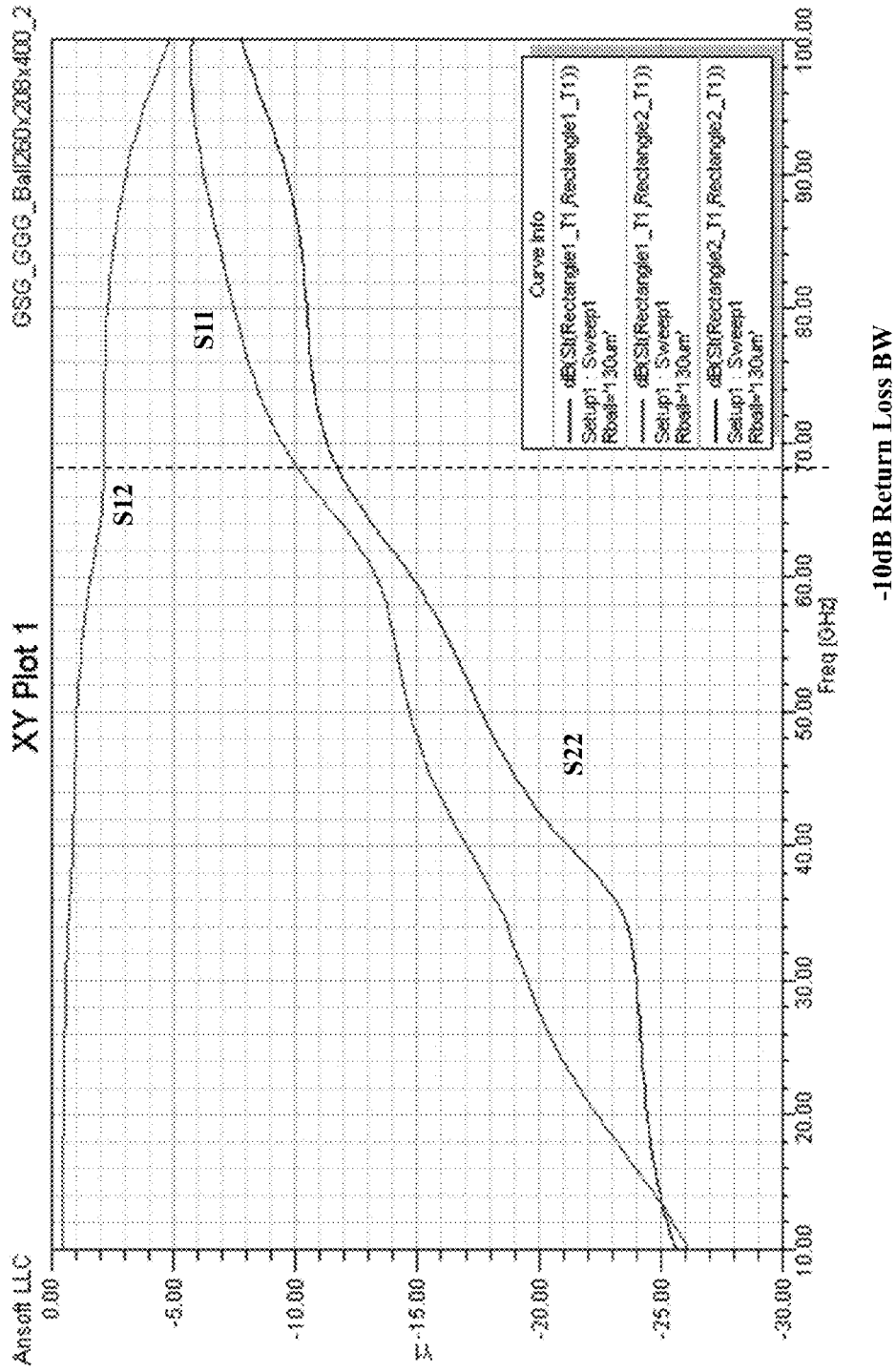
FIG. 2 shows a two-dimensional graphical depiction of simulated performance parameters for a conventional WLCSP structure including solder balls.

FIG. 2 shows a simulated performance parameter graph of a conventional WLCSP device having a 260 um solder ball diameter with 400 um pitch. Line S21 represents the signal insertion loss from chip side to the PCB side, while S11 and S22 represent the return loss (i.e. signal reflection loss) of the chip side and PCB side, correspondingly. The −10 dB return loss bandwidth of such conventional designs is slightly less than 70 GHz, with maximum in-band insertion loss of about 2 dB.

Figure 3:
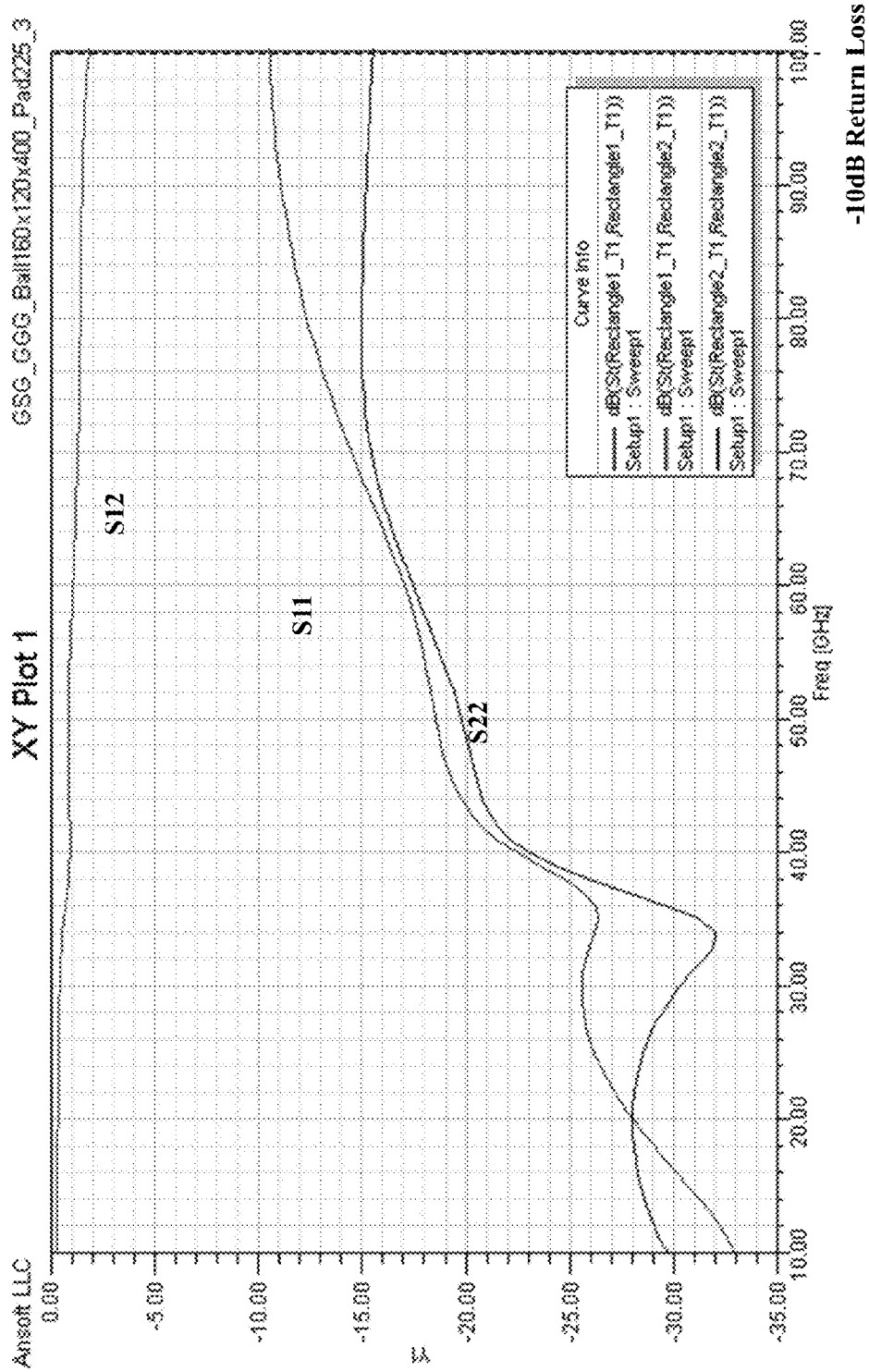
FIG. 3 shows a two-dimensional graphical depiction of simulated performance parameters for a WLCSP structure including solder balls and a printed circuit board (PCB) according to various embodiments.
Figure 4:
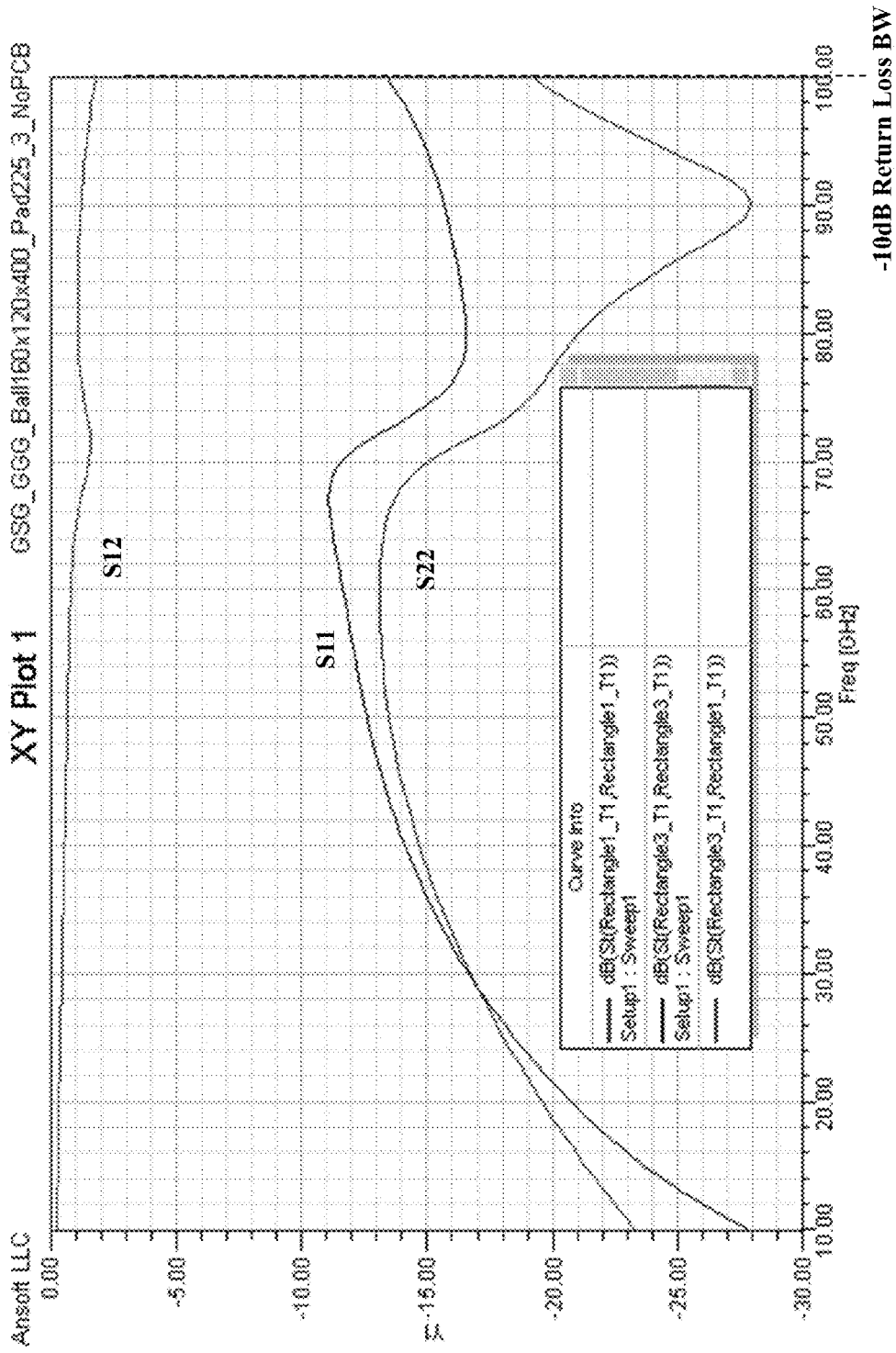
FIG. 4 shows a two-dimensional graphical depiction of simulated performance parameters for a WLCSP structure including solder balls and excluding a PCB according to various embodiments.

FIG. 3 shows the simulated performance of a WLCSP device according to embodiments of the invention, including a solder ball size of 160 um with 400 um pitch. In these cases, the −10 dB return loss bandwidth is more than 100 GHz with slightly less than 2 dB in-band insertion loss. FIG. 4 shows the simulated performance of the WLCSP device from FIG. 3, without a printed circuit board (PCB) present, i.e. the performance for the WLCSP device with the solder balls only. In this case, the device maintains the −10 dB return loss bandwidth beyond 100 GHz with the same in-band maximum insertion loss of a little less than 2 dB. This implies that the wafer level chip tests can be accurately conducted on the WLCSP device.

Figure 5:
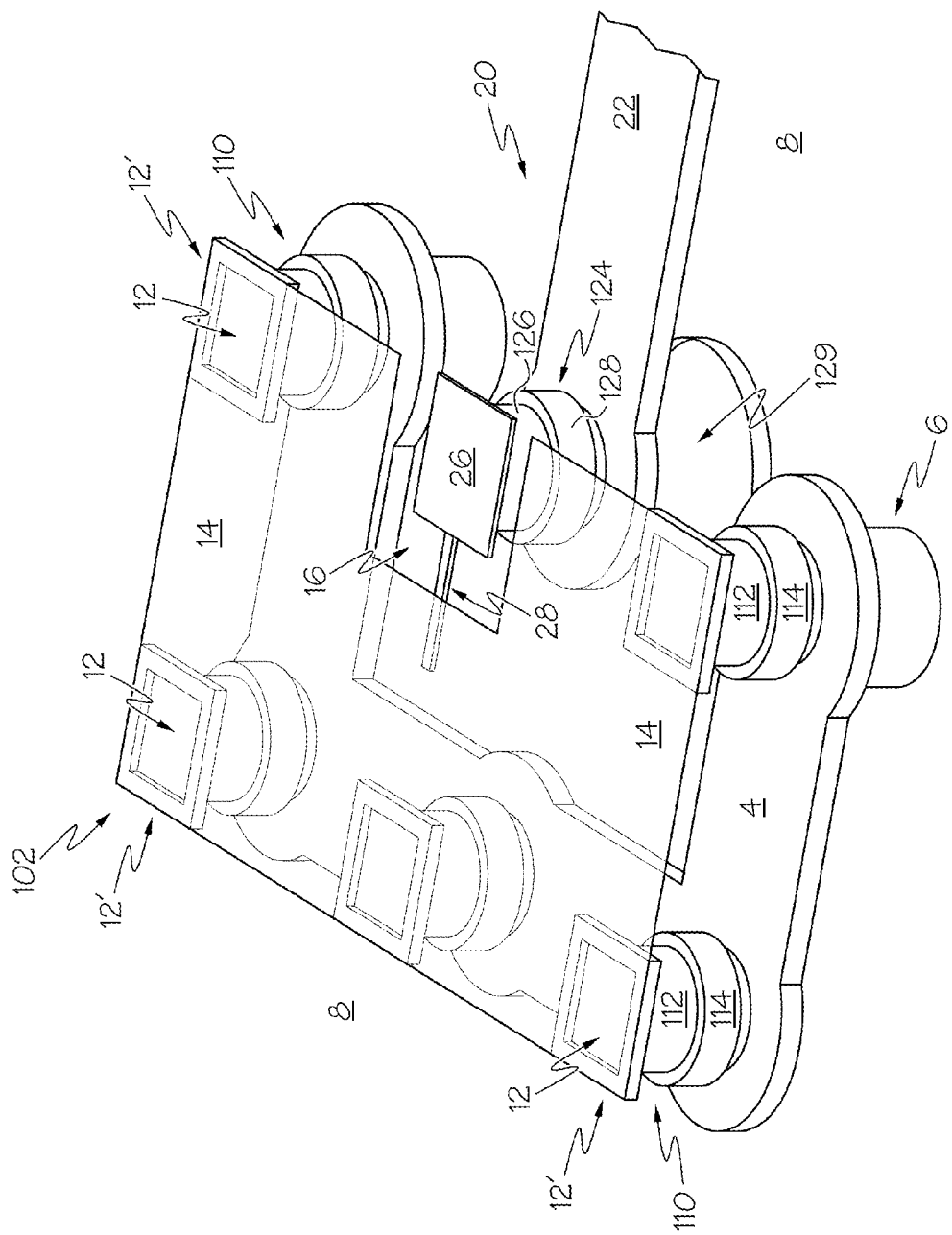
FIG. 5 shows a three-dimensional depiction of a wafer level chip scale packaging (WLCSP) structure including copper pillars according to various alternative embodiments.

FIG. 5 shows another WLCSP structure 102, which includes a printed circuit board (PCB) trace connection 4 (e.g. on the top layer of PCB) including at least one ground connection 6 (i.e. a PCB via) connected with a PCB ground plane 8, which is on a different PCB metal/wiring layer than the trace connection 4 (e.g. on the second metal/wiring layer of the PCB). It is understood that commonly numbered elements can depict substantially similar components between the Figures. That is, the PCB trace connection 4 is electrically grounded in at least one location (ground connection 6), and in this example, two such locations are shown (i.e. two PCB vias). Contacting the PCB trace connection 4 is a set of ground pillars 110, where each of the ground pillars 110 is electrically connected to the PCB ground plane 8 via the PCB trace connection 4.

Overlying and contacting each the set of ground pillars 110 is a set of chip pads 12 (e.g., integrated circuit chip pads, normally on the last metal/wiring layer of the chip), where each chip pad 12 contacts a distinct ground pillars 110 in the set of ground pillars 110. Each chip pad 12 is therefore connected to PCB ground plane 8 via a ground pillar 110 and the PCB trace connection 4.

In various embodiments, each ground pillar 110 can include a pillar section 112 contacting a corresponding chip pad 12 in the set of chip pads. Each ground pillar 110 can also include a solder joint 114 contacting the pillar section 112 and the PCB trace connection 4.

Each chip pad 12 is connected with a chip ground plane 14, which is on a different chip metal/wiring layer than the chip pad (e.g. the second metal/wiring layer of the chip), through a chip via array 12' (the annular square ring). The chip ground plane 14 can be connected to a chip ground via any conventional connection (e.g., via conventional ground connection, not shown). As shown, the PCB trace connection 4, ground pillars 110, chip pads 12, chip via arrays 12' and chip ground plane 14 form a "C-shaped" or semi annular shape having an opening 16 in a region interposed between two of the ground pillars 110.

According to various embodiments, a signal interconnect 120 is interposed between two of the ground pillars 110 (in the opening 16). The signal interconnect 120, the chip ground opening 16 and a PCB ground opening 129, as described herein, are configured to tune the WLCSP structure 102 in order to control the performance of the WLCSP structure 102. The signal interconnect 120 can include: a signal trace connection 22 on the top metal/wiring layer of the PCB (i.e. the top metal/wiring layer of the PCB) which is electrically isolated from the PCB ground plane 8, where the PCB ground plane 8 is on a different metal/wiring layer of the PCB (e.g. the second metal/wiring layer of the PCB) than the signal trace connection 22. The signal interconnect 120 can also include a signal pillar 124 contacting the signal trace connection 22, and a chip pad 26 contacting the signal pillar 124. In various embodiments, the signal trace connection 22 forms a microstrip line with the PCB ground plane 8 for carrying a signal. In various embodiments, the WLCSP structure 102 (and particularly, the signal interconnect 120), can include a signal trace 28, which may be on the same chip metal/wiring layer as the chip pads 12 (i.e. the last metal/wiring layer of the chip) and is electrically connected with the chip pad 26 contacting the signal pillar 124. The signal trace 28 is electrically isolated from the chip side ground plane 14 (on a different chip metal/wiring layer, e.g. the second metal/wiring layer of the chip). The signal trace 28 forms an on-chip microstrip line with the chip ground plane 14.

In various embodiments, the signal pillar 124 can include a pillar section 126 contacting the chip pad 26, and a solder joint 128 contacting the pillar section 126 and the signal trace connection 22. The dimensions (e.g., thickness and/or height) of the signal pillar 124 can be modifiable by modifying the pillar section 126 and/or the solder joint 128.

In some cases, the set of ground pillars 110 and the signal pillar 124 can have a substantially equal dimension, as measured along the x or y axis (diameter) and z axis (height). That is, each pillar is substantially the same size. As will be described herein, a size of the pillars is directly related to a signal performance (including, e.g., signal return and/or insertion loss) in the WLCSP structure 102. That is, the size of the pillars can control an amount of the signal insertion loss and/or signal return loss in the WLCSP structure 102. In this sense, the signal return and/or insertion loss of the WLCSP structure 102 is modifiable (tunable) by modifying a size (dimension) of the pillars.

In various embodiments, the WLCSP structure can utilize non solder mask defined pads for connection of the solder joint (114 and 128) to the PCB trace connection (4 and 22).

In various embodiments, the WLCSP structure can utilize underfill to improve the reliability of the copper pillar (112 and 126) and solder joint (114 and 128) interconnection.

Figure 6:
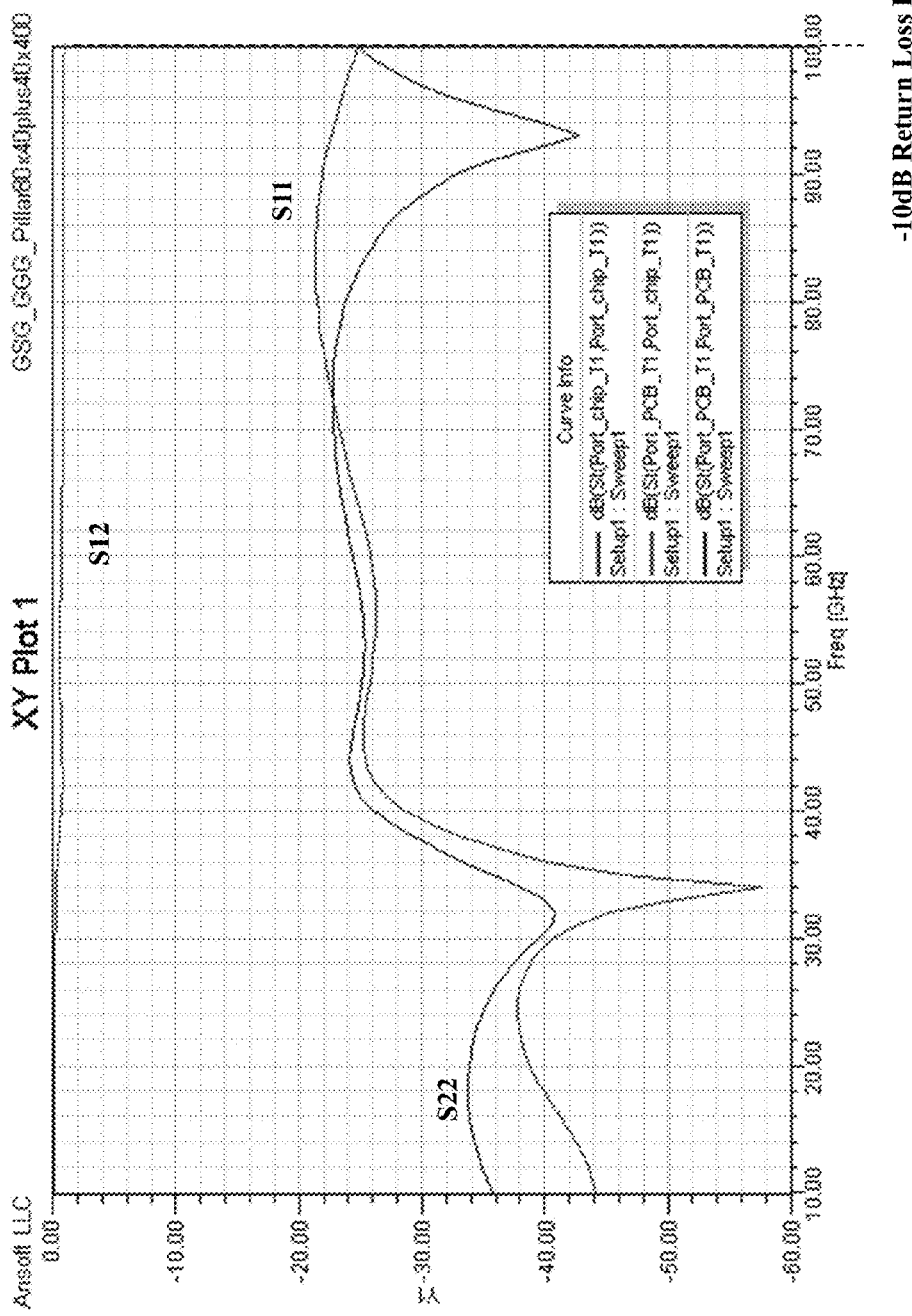
FIG. 6 shows a two-dimensional graphical depiction of simulated performance parameters for a conventional WLCSP structure including pillars and a printed circuit board (PCB).
Figure 7:
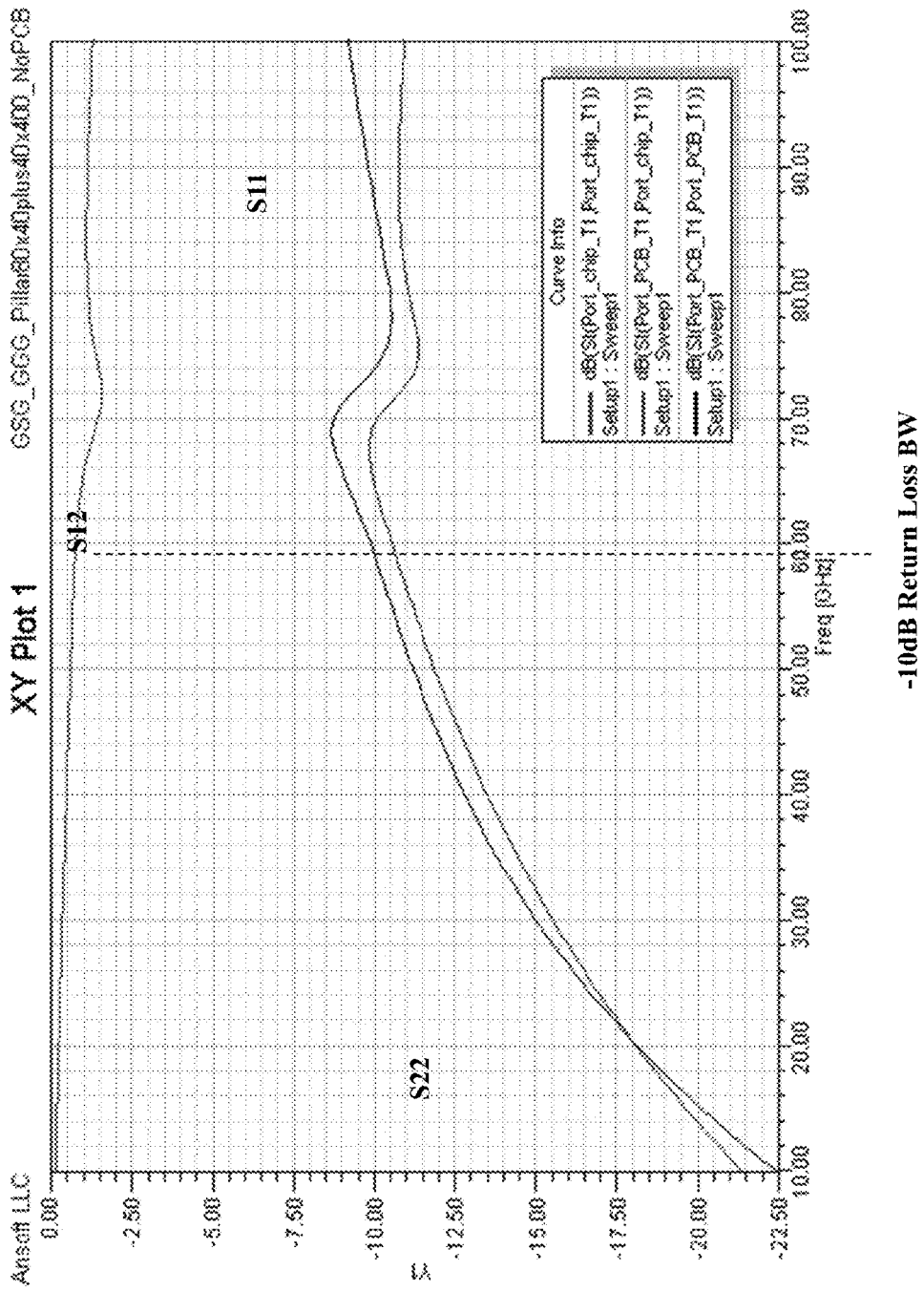
FIG. 7 shows a two-dimensional graphical depiction of simulated performance parameters for a conventional WLCSP structure including pillars and excluding a PCB.
Figure 8:
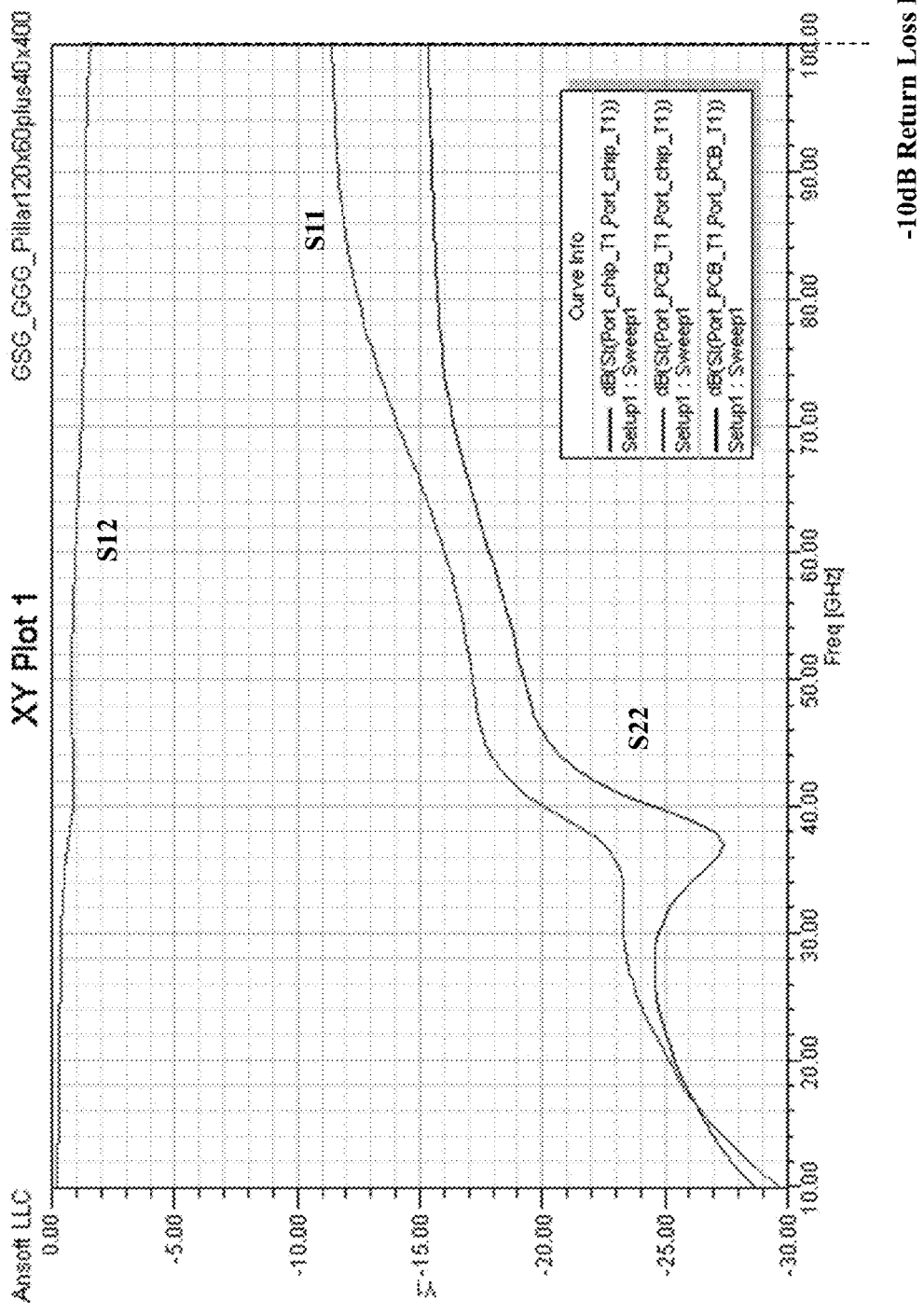
FIG. 8 shows a two-dimensional graphical depiction of simulated performance parameters for a WLCSP structure including pillars and a PCB according to various embodiments.
Figure 9:
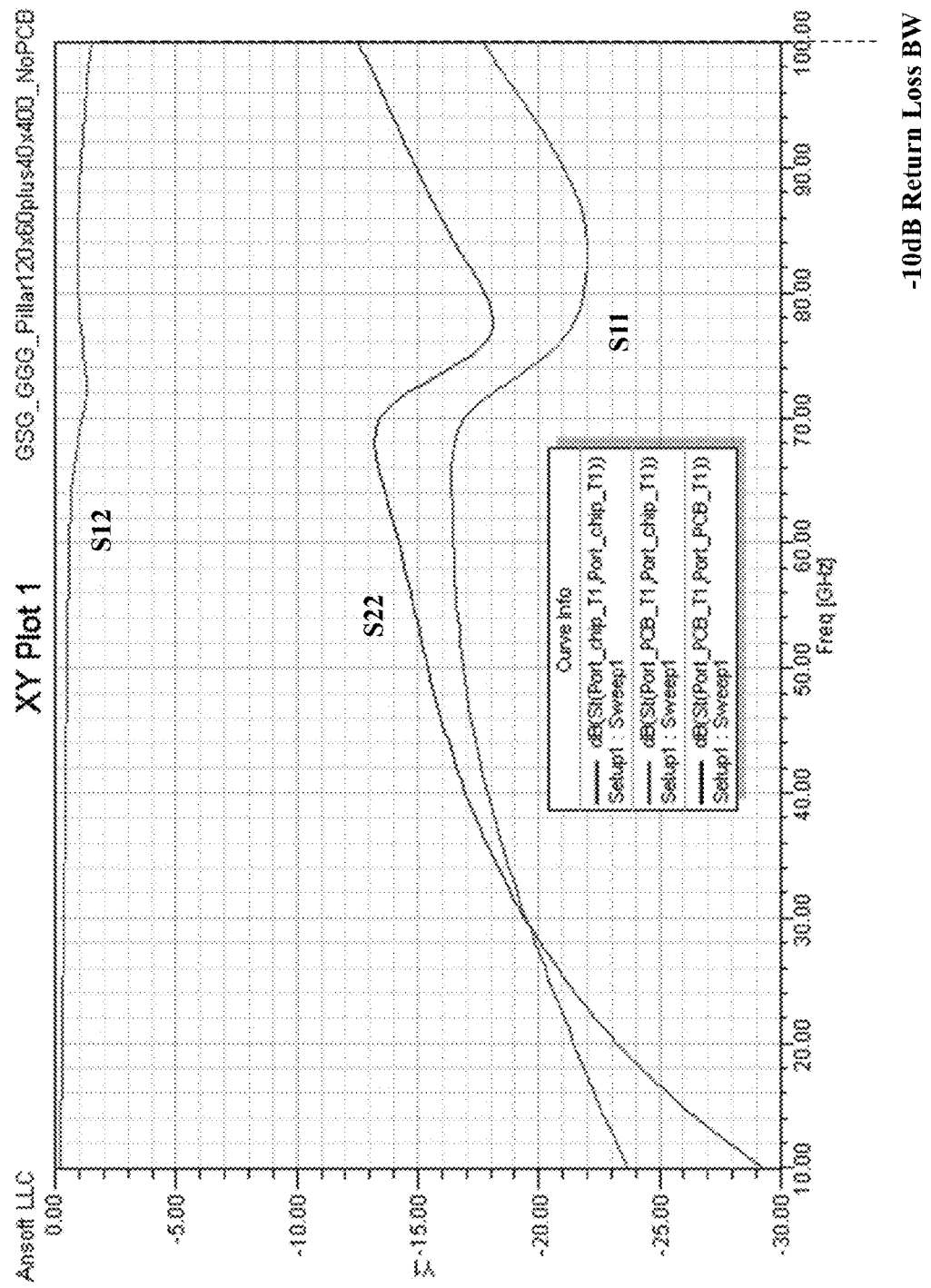
FIG. 9 shows a two-dimensional graphical depiction of simulated performance parameters for a WLCSP structure including solder balls and excluding a PCB according to various embodiments.

FIG. 6 shows a simulated performance graph of a conventional WLCSP design using an 80 um diameter pillar with 400 um pitch. In this conventional case, the −10 dB return loss bandwidth is higher than 100 GHz with in-band maximum insertion loss less than 1.5 dB. As shown in FIG. 7, a problem (return loss) arises when the PCB does not present, i.e. under wafer test conditions, where the −10 dB return loss bandwidth drops to about 60 GHz, as shown in FIG. 7. This problem can cause yield loss during wafer tests. FIG. 8 and FIG. 9 show simulated performance graphs of a WLCSP structure according to embodiments of current invention, including 120 um diameter pillars with 400 um pitch with PCB (FIG. 8) and without PCB (FIG. 9). Both graphs show the −10 dB return loss bandwidth better than 100 GHz with similar maximum in-band insertion loss of about 1.5 dB.

Various embodiments of the invention include methods of tuning a wafer level chip scale package (WLCSP) structure (e.g., the WLCSP structure 2 and/or WLCSP structure 102 shown and described herein).

A general process can include:

Process PA: providing a WLCSP structure (e.g., WLCSP structure 2 and/or WLCSP structure 102 shown and described herein);

Process PB: determining a performance parameter of the WLCSP structure;

Process PC: tuning a size of at least one of the opening in the PCB ground plane or the opening in the chip ground plane based upon the determined performance parameter. In some cases, the tuning includes at least one of: determining a distance between at least two ground contact devices in the set of ground contact devices; determining a dimension of at least one ground contact device in the set of ground contact devices; determining a size of at least one chip pad in the set of chip pads; determining a size of at least one of the signal trace connection electrically isolated from the PCB ground plane or the signal trace connection on the chip contacting the chip pad; or determining a size of at least one of the opening in the PCB ground plane or the opening in the chip ground plane;

Process PD (optionally): modifying a size of the signal contact device and the ground contact devices based upon the determined performance parameter. In some cases, the set of ground contact devices includes at least one of a set of solder balls or a set of pillars. In some cases, the signal contact device includes at least one of a solder ball or a pillar.

Figure 10:
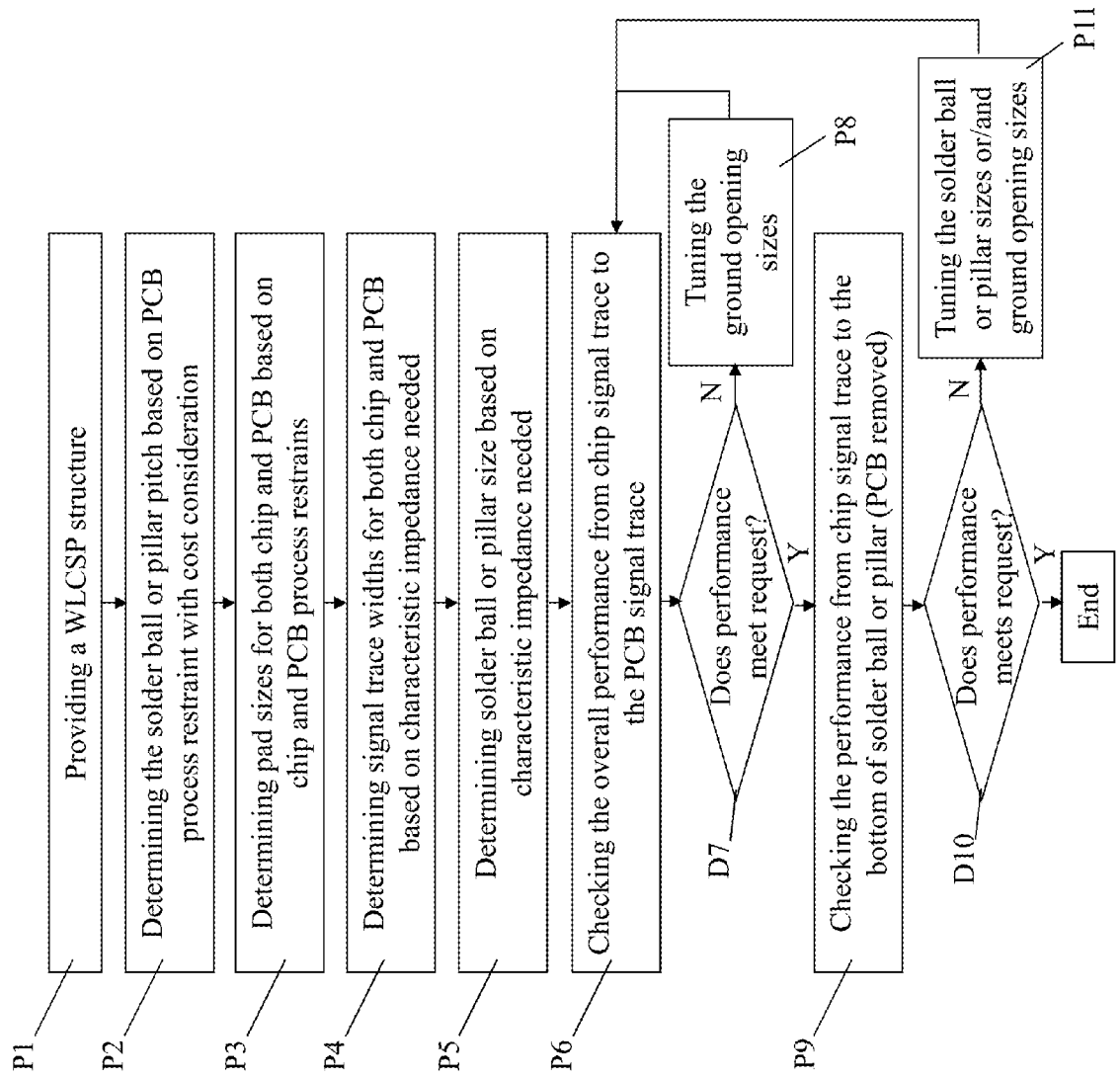
FIG. 10 shows a flow diagram illustrating processes according to various embodiments.

FIG. 10 shows an illustrative flow diagram including particular processes according to various embodiments. As shown, the method can include the following processes:

Process P1: providing a WLCSP structure (e.g., WLCSP structure 2 and/or WLCSP structure 102 shown and described herein);

Process P2: determining a solder ball or pillar or contact pitch based on PCB process restraint, PCB pad size required by in-pad via and PCB yield/cost considerations, e.g. a pitch of 400 um to 1000 um for a normal PCB process;

Process P3: determining pad sizes for both chip and PCB based on chip and PCB process restraints;

Process P4: determining the signal trace connection width for both chip and PCB based on microstrip characteristic impedance needed, e.g. 50 ohms;

Process P5: determining solder ball, pillar or contact size based on the characteristic impedance needed, e.g. choose the lateral size (diameter) to have the signal solder ball, pillar or contact to present a 50 Ohm characteristic impedance with the surrounding 5 ground solder balls, pillars or contacts vertically. In some alternative embodiments, the 5 ground solder balls, pillars or contacts may be reduced to 4 by remove the middle one and associated chip pad/chip via array, which is at the center of the semi annular shape;

Process P6: checking the overall performance from chip signal trace connection to PCB signal trace connection, such as insertion loss and return loss;

Decision D7: determining whether the performance meets the request, e.g. some design requests better than 1 dB insertion loss and 10 dB return loss bandwidth, for very high frequency, the request can be only 10 dB return loss bandwidth with no significant dip/peak in the return loss;

Process P8 (No to Decision D7): tuning the ground opening sizes to improve the performance. Then repeating process P6;

Process P9 (Yes to Decision D7): checking the performance from chip signal trace connection to the bottom of the solder ball, pillar or contact. This simulates the wafer test situation in which the PCB is not present;

Decision D10: determine whether "wafer only" performs similar to the case with PCB, such as similar −10 dB return loss bandwidth and in-band insertion loss;

Process P11 (No to decision D10): tuning the solder ball, pillar or contact size and/or ground opening sizes, and returning to process P6.

If Yes to Decision D10, End.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A wafer level chip scale package (WLCSP) structure comprising:
   a printed circuit board (PCB) trace connection including at least one PCB ground connection connected with a PCB ground plane;
   a set of ground solder balls each contacting the printed circuit board trace connection;
   a set of chip pads contacting each of the ground solder balls in the set of ground solder balls;
   a chip ground plane connecting the set of chip pads; and
   a signal interconnect interposed between two of the set of ground solder balls, the signal interconnect including:
      a signal trace connection electrically isolated from the PCB ground plane,
      wherein the signal trace connection electrically isolated from the PCB ground plane includes a conductive strip which forms a microstrip line with the PCB ground plane for carrying a signal;
      a signal ball contacting the signal trace connection, wherein a diameter of the signal ball controls an amount of signal loss in the WLCSP structure;
      a chip pad contacting the signal ball; and
      a signal trace connection on a chip contacting the chip pad.

2. The WLCSP structure of claim 1, wherein the signal trace connection on the chip includes a conductive strip on the chip that forms an on-chip microstrip line with the chip ground plane.

3. The WLCSP structure of claim 1, wherein the chip ground plane includes an opening above the signal chip pad, and the PCB ground plane includes an opening underneath the signal solder ball for performance tuning.

4. The WLCSP structure of claim 1, wherein the set of ground solder balls and signal solder ball each have a substantially equal diameter.

5. The WLCSP structure of claim 1, wherein the amount of the signal loss of the WLCSP structure is tunable by modifying the diameter of the signal ball.

6. The WLCSP structure of claim 3, wherein the opening above the signal chip pad leaves the signal chip pad exposed above the chip ground plane.

7. The WLCSP structure of claim 3, wherein the chip ground plane forms a semi annular shape having the opening above the signal chip pad, the opening above the signal chip pad located in a region interposed between the two of the set of ground solder balls.

8. The WLCSP structure of claim 1, wherein the signal trace connection on the chip contacting the chip pad is a single piece of metal.

9. A wafer level chip scale package (WLCSP) structure comprising:
   a printed circuit board (PCB) trace connection including at least one PCB ground connection connected with a PCB ground plane;
   a set of ground solder balls each contacting the printed circuit board trace connection;
   a set of chip pads contacting each of the ground solder balls in the set of ground solder balls;
   a chip ground plane connecting the set of chip pads; and
   a signal interconnect interposed between two of the set of ground solder balls, the signal interconnect including:
      a signal trace connection electrically isolated from the PCB ground plane,
      wherein the signal trace connection electrically isolated from the PCB ground plane includes a conductive strip which forms a microstrip line with the PCB ground plane for carrying a signal;
      a signal ball contacting the signal trace connection;
      a chip pad contacting the signal ball; and
      a signal trace connection on a chip contacting the chip pad,
      wherein a diameter of the signal ball controls an amount of signal loss in the WLCSP structure,
   wherein the chip ground plane includes an opening above the signal chip pad, and the PCB ground plane includes an opening underneath the signal solder ball for performance tuning,
   wherein the chip ground plane forms a semi annular shape having the opening above the signal chip pad, the opening above the signal chip pad located in a region interposed between the two of the set of ground solder balls.

* * * * *